United States Patent
Joshi et al.

(10) Patent No.: US 9,247,679 B2
(45) Date of Patent: Jan. 26, 2016

(54) JET IMPINGEMENT COOLERS AND POWER ELECTRONICS MODULES COMPRISING THE SAME

(71) Applicant: Toyota Motor Engineering & Manufacturing North America, Inc., Erlanger, KY (US)

(72) Inventors: Shailesh N. Joshi, Ann Arbor, MI (US); Ercan Mehmet Dede, Ann Arbor, MI (US); Mayur Prakash Gaikwad, Houghton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 312 days.

(21) Appl. No.: 13/902,003

(22) Filed: May 24, 2013

(65) Prior Publication Data

US 2014/0347817 A1 Nov. 27, 2014

(51) Int. Cl.
*H05K 7/20* (2006.01)
*H01L 23/473* (2006.01)

(52) U.S. Cl.
CPC ........ *H05K 7/20927* (2013.01); *H01L 23/4735* (2013.01); *H01L 2924/0002* (2013.01)

(58) Field of Classification Search
CPC ........... H01L 23/4735; H05K 7/20009; H05K 7/20136; H05K 7/20145; H05K 7/20154; H05K 7/20163; H05K 7/202
USPC ................... 361/689–694, 699–703; 165/168
See application file for complete search history.

(56) References Cited

U.S. PATENT DOCUMENTS

| | | | |
|---|---|---|---|
| 4,583,582 A | 4/1986 | Grossman | |
| 5,067,047 A | 11/1991 | Azar | |
| 5,269,372 A * | 12/1993 | Chu et al. | 165/80.4 |
| 5,402,004 A | 3/1995 | Ozmat | |
| 5,841,634 A * | 11/1998 | Visser | 361/699 |
| 6,123,145 A | 9/2000 | Glezer et al. | |
| 6,366,462 B1 * | 4/2002 | Chu et al. | 361/699 |
| 6,952,346 B2 | 10/2005 | Tilton et al. | |

(Continued)

FOREIGN PATENT DOCUMENTS

| | | |
|---|---|---|
| JP | 10121110 | 5/1998 |
| WO | 98/44307 | 10/1996 |
| WO | WO2005029555 | 3/2005 |

OTHER PUBLICATIONS

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

(Continued)

*Primary Examiner* — Adam B Dravininkas
(74) *Attorney, Agent, or Firm* — Dinsmore & Shohl LLP

(57) ABSTRACT

Jet impingement assemblies and power electronics devices incorporating jet impingement assemblies are described. The jet impingement assemblies include a fluid inlet, a fluid outlet, a manifold, and a heat distribution member. The manifold includes a distribution side in fluid communication with the fluid inlet, a collection side in fluid communication with the fluid outlet, a plurality of orifices extending from the distribution side to the collection side, and a return channel extending from the collection side to the distribution side. The heat distribution member is positioned proximate to the collection side of the manifold.

18 Claims, 8 Drawing Sheets

(56) References Cited

U.S. PATENT DOCUMENTS

| | | | |
|---|---|---|---|
| 6,986,382 B2 | 1/2006 | Upadhya et al. | |
| 6,988,535 B2 | 1/2006 | Upadhya et al. | |
| 7,277,283 B2 | 10/2007 | Campbell et al. | |
| 7,375,962 B2 | 5/2008 | Campbell et al. | |
| 7,511,957 B2 | 3/2009 | Campbell et al. | |
| 7,530,778 B2 | 5/2009 | Yassour et al. | |
| 7,571,618 B2 | 8/2009 | Dessiatoun | |
| 7,597,135 B2 | 10/2009 | Ghosh et al. | |
| 7,639,030 B2 | 12/2009 | Wadell | |
| 7,762,314 B2 | 7/2010 | Campbell et al. | |
| 7,841,843 B2 | 11/2010 | Cho et al. | |
| 7,885,074 B2 | 2/2011 | Campbell et al. | |
| 7,921,664 B2 | 4/2011 | Rini et al. | |
| 7,942,997 B2 | 5/2011 | Rivas et al. | |
| 7,992,627 B2 | 8/2011 | Bezama et al. | |
| 8,059,405 B2 | 11/2011 | Campbell et al. | |
| 8,074,706 B2 | 12/2011 | Su et al. | |
| 8,077,460 B1 | 12/2011 | Dede et al. | |
| 8,081,461 B2 | 12/2011 | Campbell et al. | |
| 8,118,084 B2 | 2/2012 | Harvey | |
| 8,194,406 B2 | 6/2012 | Campbell et al. | |
| 8,391,008 B2 | 3/2013 | Dede | |
| 2004/0104022 A1* | 6/2004 | Kenny et al. | 165/299 |
| 2006/0048918 A1* | 3/2006 | Nakahama | 165/80.4 |
| 2007/0084587 A1 | 4/2007 | Huang et al. | |
| 2007/0119565 A1* | 5/2007 | Brunschwiler et al. | 165/80.2 |
| 2009/0032937 A1* | 2/2009 | Mann et al. | 257/712 |
| 2010/0044018 A1 | 2/2010 | Furberg et al. | |
| 2010/0097760 A1 | 4/2010 | Azar et al. | |
| 2011/0146955 A1 | 6/2011 | Chen | |
| 2011/0272120 A1 | 11/2011 | Joshi et al. | |
| 2012/0048515 A1* | 3/2012 | Bhunia et al. | 165/104.25 |
| 2012/0063091 A1* | 3/2012 | Dede et al. | 361/699 |
| 2012/0097368 A1 | 4/2012 | Chen et al. | |
| 2012/0168145 A1 | 7/2012 | Peterson et al. | |
| 2012/0170222 A1* | 7/2012 | Dede et al. | 361/702 |
| 2012/0181005 A1* | 7/2012 | Downing | 165/166 |
| 2012/0212907 A1 | 8/2012 | Dede | |
| 2012/0279684 A1 | 11/2012 | Keisling et al. | |
| 2013/0020059 A1 | 1/2013 | Perk | |

OTHER PUBLICATIONS

Brignoni, L., Garimella, S., "Performance Characteristics of Confined Impinging Air Jets with Surface Enhancement," Advances in Electronic Packaging, vol. 26-2, 1999: 2009-2014.

Ei-Sheikh, H., Garimella, S., "Heat Transfer from Pin-Fin Heat Sinks under Multiple Impinging Jets," IEEE Transactions on Advanced Packaging, vol. 23-1, 2000: 113-120.

http://academiccommons.columbia.edu/catalog/ac%3A131465; "Micro-Evaporator Design and Investigation of Phase Change in Tailored Microchannels"; Selin Arslan; Graduate School of Arts and Sciences, Columbia University, 2011.

http://digitalcommons.mcmaster.ca/cgi/viewcontent.cgi?article=7365&context=opendissertations; "Effect of surface finish on boiling heat transfer at stagnation point under free liquid jet impingement".

http://www.sciencedirect.com/science/article/pii/S0017931098003378; "An experimental study of slot jet impingement cooling on concave surface: effects of nozzle configuration and curvature".

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-2839.

https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.

https://www.lboro.ac.uk/research/iemrc/documents/EventsDocuments/3rd%20conference%202008/Presentations/opt%20cooling%20Skuriat%20notts.pdf; "Optimum Cooling Solutions for Power Electronics"; Robert Skuriat, Nottingham University, Jul. 4, 2008.

Brunschwiler, T., H. Rothuizen, M. Fabbri, U. Kloter, B. Michel, R.J. Benzama, and G. Natarajan. Direct Liquid Jet-Impingement Cooling With Micron-Sized Nozzle Array and Distributed Return Architecture. Proc. of the Tenth Intersociety Conference on Thermal and Thermomechanical Phenomena in Electronics Systems, San Diego, CA, 2006: 196-203.

Wadsworth, D.C., Mudawar, I., "Cooling of a Multichip Electronic Module by Means of Confined Two-Dimensional jets of dielectric liquid," Transactions of the ASME Journal of Heat Transfer, vol. 112, 1990: 891-898.

Notice of Allowance relating to U.S. Appl. No. 13/734,710, mailed Oct. 2, 2013.

Z. Q. Chen et al., "An experimental study of two phase flow and boiling heat transfer in bi-dispersed porous channels," available at http://www.me.ust.hk~mezhao/pdf/49.PDF.

Palm et al., "Enhancement of Boiling Heat transfer by Application of a Porous Layer," available at: http://www.energy.kth.se/index.asp?pnr=10&ID=125&lang=0.

Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2Fabs_all.jsp%3Farnumber%3D6231577.

J. P. Li, et al., Porous Ti6AI4V scaffold directly fabricating by rapid prototyping: Preparation and in vitro experiment; Science Direct; Biomaterials 27 (2006) 1223-1235.

U.S. Appl. No. 13/683,660, filed Nov. 21, 2012 entitled "Cooling Apparatuses Having Sloped Vapor Outlet Channels".

* cited by examiner

JET IMPINGEMENT COOLERS AND POWER ELECTRONICS MODULES COMPRISING THE SAME

TECHNICAL FIELD

The present specification generally relates to jet impingement coolers and, more particularly, jet impingement coolers having internal flow control features.

BACKGROUND

Heat management devices may be coupled to a heat generation device, such as a power electronics device, to remove heat and lower the operating temperature of the heat generating device. A fluid may be introduced to the heat management device, and may receive heat from the heat management device, primarily through convective and/or conductive heat transfer, thereby removing heat from the heat generating device. In one example, fluid may be directed in a jet in a localized region at a high velocity such that the fluid impinges a surface of the heat generating device.

As power electronic devices are designed to operate at increased power levels, the power electronics devices generate an increased corresponding heat flux. The increase in heat flux generated by the power electronics devices may render conventional heat sinks inadequate to reject sufficient heat to maintain a desired operating temperature in the power electronics device.

Accordingly, heat management devices that incorporate jet impingement coolers may be desired to mitigate high temperature operation of the power electronics devices.

SUMMARY

In one embodiment, a jet impingement assembly includes a fluid inlet, a fluid outlet, a manifold, and a heat distribution member. The manifold includes a distribution side in fluid communication with the fluid inlet, a collection side in fluid communication with the fluid outlet, a plurality of orifices extending from the distribution side to the collection side, a return channel extending from the collection side to the distribution side, and a plurality of flowpath constriction members positioned on the collection side. The heat distribution member is positioned proximate to the collection side of the manifold, and includes a plurality of fins that extend towards the collection side of the manifold.

In another embodiment, a jet impingement assembly includes a fluid inlet, a fluid outlet, a manifold, and a heat distribution member. The manifold includes a distribution side in fluid communication with the fluid inlet, a collection side in fluid communication with the fluid outlet, a plurality of orifices extending from the distribution side to the collection side, a return channel extending from the collection side to the distribution side, and a plurality of flow conditioning members positioned along the distribution side. The heat distribution member is positioned proximate to the collection side of the manifold.

In yet another embodiment, a power electronics module includes a jet impingement assembly and an electronics device. The jet impingement assembly includes a fluid inlet, a fluid outlet, a manifold having a distribution side in fluid communication with the fluid inlet, a collection side in fluid communication with the fluid outlet, a plurality of orifices extending from the distribution side to the collection side, and a return channel extending from the collection side to the distribution side, and a heat distribution member positioned proximate to the collection side of the manifold. The heat distribution member includes a plurality of fins that extend towards the collection side of the manifold. The electronics device is positioned to contact the heat distribution member opposite the plurality of fins.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
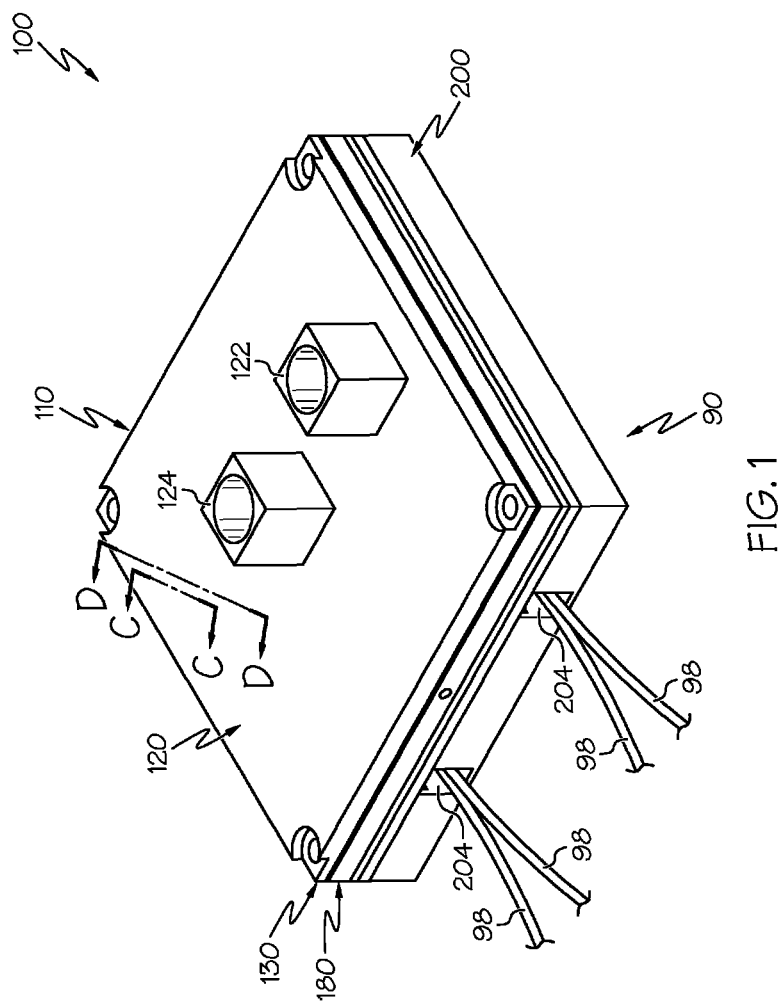
FIG. 1 schematically depicts a side perspective view of a power electronics device incorporating a jet impingement assembly according to one or more embodiments shown or described herein.
Figure 2:
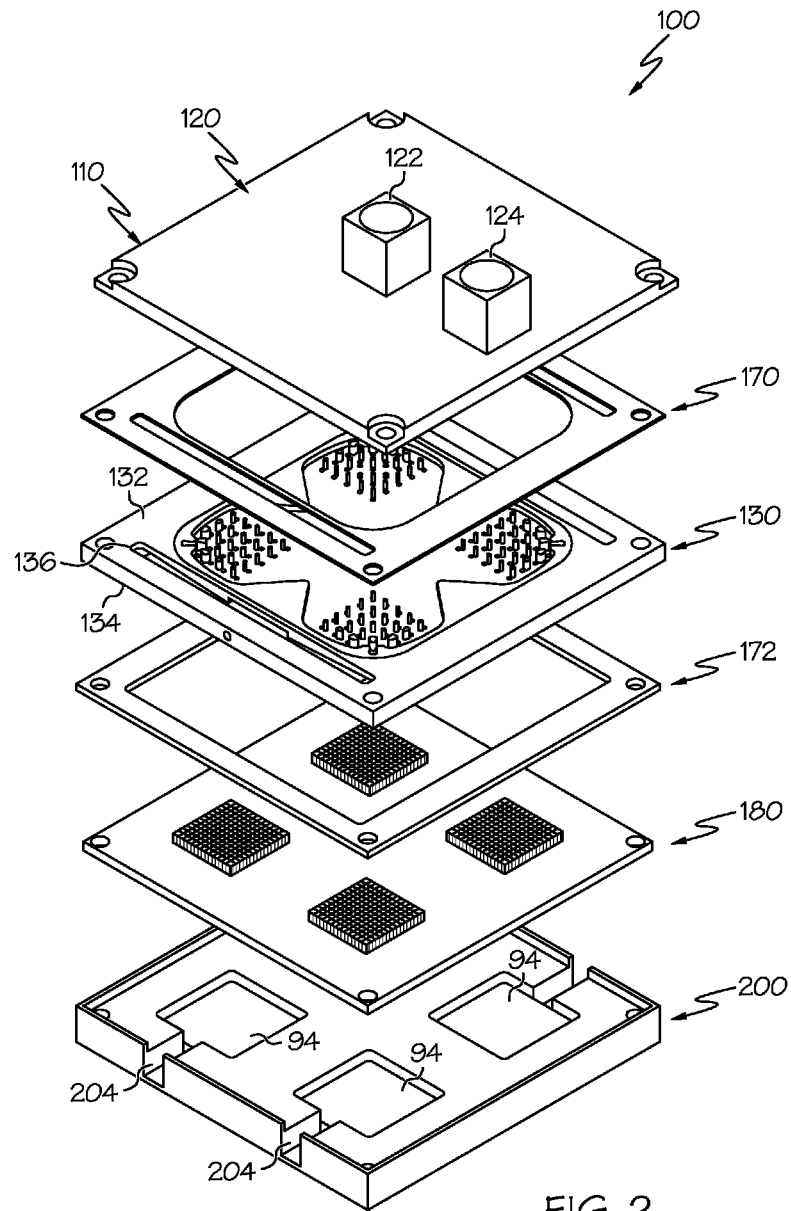
FIG. 2 schematically depicts an exploded side perspective view of a power electronics device incorporating a jet impingement assembly according to one or more embodiments shown or described herein.

One embodiment of a heat management device that incorporates a jet impingement assembly is generally depicted in FIGS. 1 and 2. The jet impingement assembly includes a manifold having a distribution side in fluid communication with a fluid inlet and a collection side in fluid communication with a fluid outlet. The manifold includes a plurality of orifices that extend from the distribution side to the collection side, and a return channel extending from the collection side to the distribution side. The manifold may also include a plurality of flowpath constriction members positioned on the collection side. An electronics device is positioned to contact a heat distribution member. The heat distribution member includes a plurality of fins that extend from the baseline surface. The heat distribution member is positioned proximate to the manifold such that fluid passing through the orifices is directed onto the fins of the heat distribution member, thereby removing heat from the heat distribution member. The flowpath constriction members may reduce the cross-sectional area between the manifold and the heat distribution member, thereby directing fluid flow away from the heat distribution member at positions between the flow constriction members. Various embodiments of the heat management devices and power electronic modules incorporating heat management devices will be described in more detail herein.

Referring to FIG. 1, one embodiment of the power electronics module 90 includes a jet impingement assembly 100 and a plurality of electronics devices 94 (shown in FIG. 3) positioned within receptacles 204 of the jet impingement assembly 100. The jet impingement assembly 100 includes cooling portion 110 and a support portion 200. The cooling portion 110 includes a cap 120, a manifold 130, and a heat distribution member 180 that are coupled to one another in a fluid-tight assembly. Electronics devices are positioned within the receptacles 204 of the support portion 200, with the electrical leads 98 of the electronics devices passing through the walls of the support portion 200. The electronics devices remain in contact with the heat distribution member 180 when the cooling portion 110 is coupled to the support portion 200.

The power electronics module 90 may be configured as a drive circuit for a high-power application, such as an electric motor drive circuit of a hybrid-electric vehicle or an electric vehicle. Although embodiments may be described herein in the context of vehicular applications, embodiments are not limited thereto. Embodiments may be utilized in other high-power electrical applications.

Figure 3:
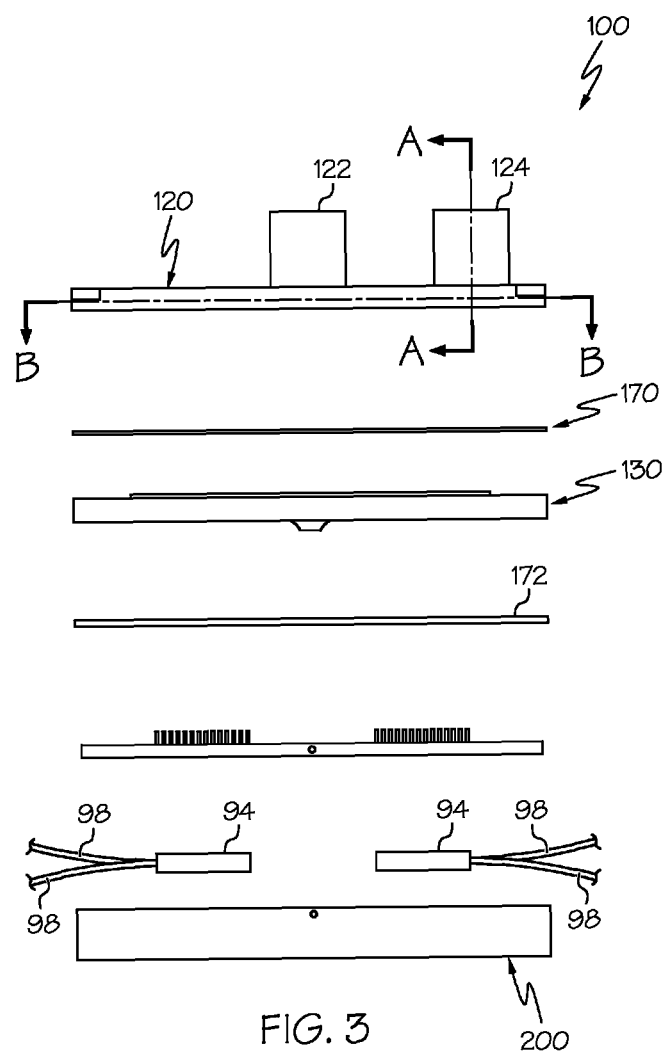
FIG. 3 schematically depicts an exploded side view of a power electronics device incorporating a jet impingement assembly according to one or more embodiments shown or described herein.

Referring now to FIGS. 2 and 3, one embodiment of the jet impingement assembly 100 is depicted in an exploded orientation. In this embodiment, the cooling portion 110 of the jet impingement assembly 100 includes the cap 120. The cap 120 includes a fluid inlet 122 and a fluid outlet 124. Cooling fluid is introduced to the jet impingement assembly 100 through the fluid inlet 122, is directed through the internal passages of the jet impingement assembly 100, as will be discussed below, and is directed out of the jet impingement assembly 100 through the fluid outlet 124.

The jet impingement assembly 100 also includes the manifold 130 and the heat distribution member 180. The jet impingement assembly 100 may also include a first gasket 170 positioned between the cap 120 and the manifold 130 and a second gasket 172 positioned between the manifold 130 and the heat distribution member 180. The first gasket 170 and the second gasket 172 maintain a fluid-tight seal between adjacent components of the jet impingement assembly 100 such that fluid introduced to the jet impingement assembly 100 may be maintained in a closed-loop cooling system as the fluid circulates through the jet impingement assembly 100.

Examples of fluids that may be used in conjunction with the jet impingement assembly 100 include a variety of fluids including, for example and without limitation, water, organic solvents, and inorganic solvents. Examples of such solvents may include commercial refrigerants such as R-134a, R717, and R744. Selection of the composition of the fluid used in association with the jet impingement assembly 100 may be selected based on, among other properties, the boiling point, the density, and the viscosity of the fluid.

Components of the jet impingement assembly 100 may be constructed from a variety of materials. In certain embodiments, the cap 120 and the manifold 130 may be made from a generally thermally insulative material, for example and without limitation, a thermoplastic, a thermoset, or a composite material. In other embodiments, the cap 120 and the manifold 130 may be made from a generally thermally conductive material, for example and without limitation, copper, aluminum, steel or the like. The heat distribution member 180 may be made from a thermally conductive material, for example and without limitation, copper, aluminum, steel, thermally enhanced composite materials, or polymeric composite materials. The first gasket 170 and the second gasket 172 may be made from a variety of materials that provide a fluid-tight seal between the generally non-compliant bodies of the jet impingement assembly 100. Examples of such materials include, without limitation, natural or synthetic elastomers, compliant polymers such as silicone, and the like. The first gasket 170 and the second gasket 172 may also me made from an assembly that includes compliant materials and non-compliant materials, such that the first gasket 170 and the second gasket 172 provide desired sealing characteristics while maintaining their geometric configuration.

The electronics devices 94 may comprise one or more electronics devices 94, a circuit board, and various control circuit components. The power electronics device or devices may be one or more semiconductor devices that may include, without limitation, IGBTs, RC-IGBTs, MOSFETs, power MOSFETs, diodes, transistors, and/or combinations thereof. The electronics devices 94 may be mounted on a first side of the circuit board such that one surface of the electronics device 94 is thermally coupled to the heat distribution member 180. The control circuit components may be mounted on a side of the circuit board that is opposite from the electronics device 94. The control circuit components may include discrete and active components that are configured to control or otherwise drive the electronics device 94.

As described above, the electronics devices 94 may be thermally coupled to the exposed surface of the heat distribution member 180. In one embodiment, the electronics devices 94 are thermally coupled to the heat distribution member 180 via an intermediate, thermally conductive substrate layer (not shown) (for example and without limitation, epoxy, direct bonded copper (DBC), direct bonded aluminum (DBA), or similar materials). The electronics devices 94 may be bonded to the substrate layer by bonding techniques such as soldering, transient liquid phase bonding (TLP), or nano-silver sintering, for example.

Figure 4:
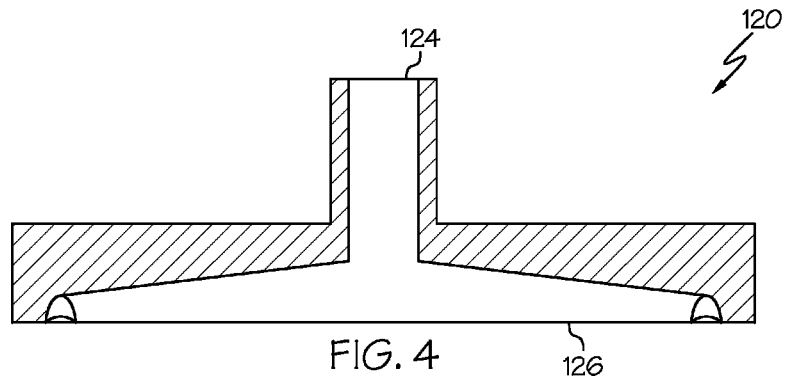
FIG. 4 schematically depicts a side sectional view of a cap of the jet impingement assembly shown along line A-A of FIG. 3 according to one or more embodiments shown or described herein.
Figure 5:
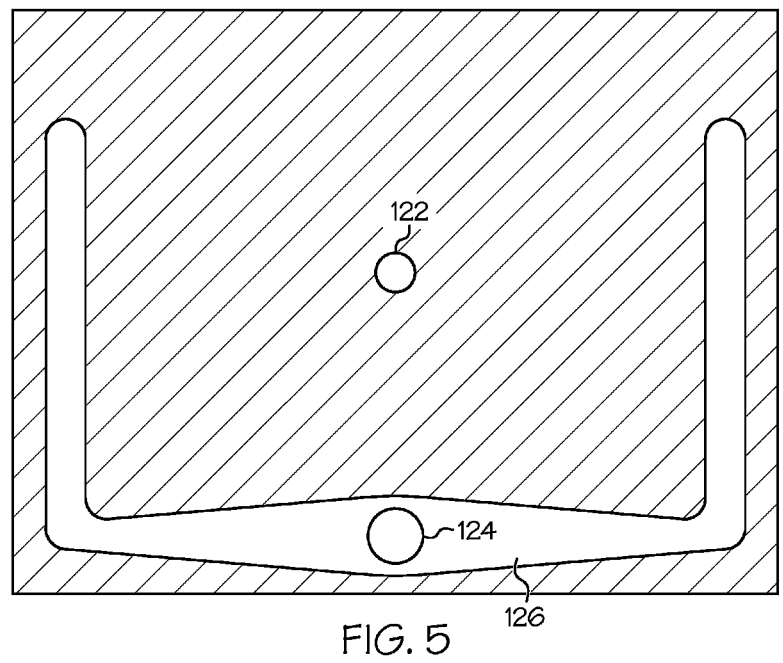
FIG. 5 schematically depicts a top sectional view of a cap of the jet impingement assembly shown along line B-B of FIG. 3 according to one or more embodiments shown or described herein.

Referring now to FIGS. 4 and 5, cross-sectional views of the cap 120 are depicted. The cap 120 includes an outlet flow guide 126 that is adapted to be in fluid communication with the return channel 136 of the manifold 130. In the embodiment depicted in FIGS. 4 and 5, the outlet flow guide 126 increases in volume at positions proximate to the fluid outlet 124. As depicted in FIG. 4, the outlet flow guide 126 is tapered to have an increasing vertical height at positions proximate to the fluid outlet 124. As depicted in FIG. 5, the outlet flow guide 126 is tapered to have an increasing horizontal width at positions proximate to the fluid outlet 124. The sloping configuration of the walls of the outlet flow guide 126 in the vertical and horizontal orientations may increase the cross-sectional flow area of the outlet flow guide 126 at positions proximate to the fluid outlet 124 as compared to positions distal from the fluid outlet 124. The increase in cross-section area may reduce any resistance to fluid flow in directions towards the fluid outlet 124, thereby directing heated fluid to exit away from the heat distribution member 180. While one configuration of the outlet flow guide 126 is depicted in FIGS. 4 and 5, it should be understood that the outlet flow guide 126 may take a variety of configurations including having a variety of slopes, lengths, discontinuous portions, non-linear portions, and the like without departing from the scope of the present disclosure.

As will be discussed further below, heated fluid that is flowing away from the heat distribution member 180 passes through the return channels 136 and is directed to the outlet flow guide 126 of the cap 120. The outlet flow guide 126 places the return channels 136 in fluid communication with the fluid outlet 124. The increasing cross-sectional area of the outlet flow guide 126 at positions proximate to the fluid outlet 124 may reduce resistance to fluid flow in the outlet flow guide 126 away from the heat distribution member 180. Further, because of the geometric configuration of the outlet flow guide 126 sloping away from heat distribution member 180 in directions that encourage fluid to flow towards the fluid outlet 124, fluid stagnation, including stagnation and pressure build-up of vapor that has changed phase due to an increase in temperature, may be minimized. Pressure build-up in jet impingement assembly 100 may decrease overall heat transfer performance of the jet impingement assembly 100 and may therefore be undesired. By maintaining the sloped geometry away from the heat distribution member 180, fluid is encouraged to flow towards the fluid outlet 124. Fluid stagnation in the outlet flow guide 126 may therefore be minimized, which may reduce the backpressure within the jet impingement assembly 100 that may otherwise reduce the flow rates of fluid through the jet impingement assembly 100.

Figure 6:
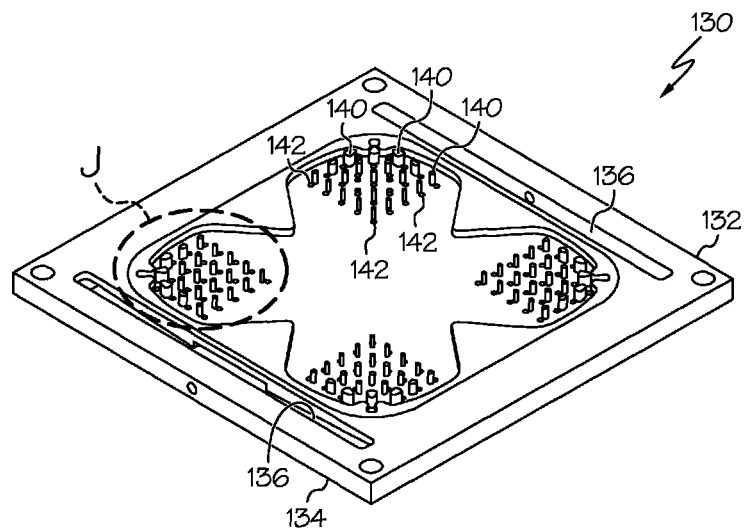
FIG. 6 schematically depicts a side perspective view of a manifold of a jet impingement assembly according to one or more embodiments shown or described herein.

Referring now to FIG. 6, the manifold 130 of the jet impingement assembly is depicted in detail. The manifold 130 includes a distribution side 132 and a collection side 134. Fluid introduced to the jet impingement assembly is directed towards the distribution side 132 of the manifold 130, where the fluid is dispersed for ejection towards the electronics devices 94. The manifold 130, therefore, distributes fluid to the heat distribution member 180 to maintain the temperature of the electronics devices 94. The manifold 130 also includes at least one return channel 136 that extends from the collection side 134 to the distribution side 132. Heated fluid is directed from the collection side 134 through the return channel 136 and towards the fluid outlet 124, thereby allowing unheated fluid to flow to the collection side 134.

Still referring to FIG. 6, the manifold 130 includes a plurality of orifices 142 that extend through the manifold 130 between the distribution side 132 and the collection side 134. Fluid, which is introduced to the distribution side 132 at an elevated pressure relative to the collection side 134, passes through the orifices 142 and is directed onto the heat distribution member 180. The relative pressure balance of the fluid that is maintained along the distribution side 132 and the collection side 134 of the manifold 130 may control the shape and intensity of the resulting jet of fluid that is ejected from the orifices 142. In general, the greater the pressure applied to the fluid on the distribution side 132, the higher the velocity of the jet, and the higher convection heat transfer rate away from the heat distribution member 180. While orifices 142 having generally cylindrical shapes and circular cross sections through the manifold 130 are depicted, it should be understood that the geometry of the orifices may take a variety of sizes and shapes to provide jets of fluid to transfer heat away from the heat distribution member 180. Similarly, the pattern of the orifices 142 along the manifold 130 may vary based on the cooling requirements of a particular application.

Figure 7:
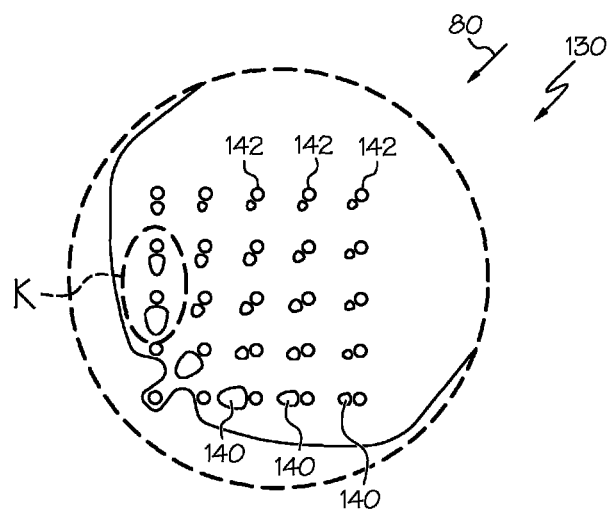
FIG. 7 schematically depicts a detailed top view of the manifold shown at location J of FIG. 6.
Figure 8:
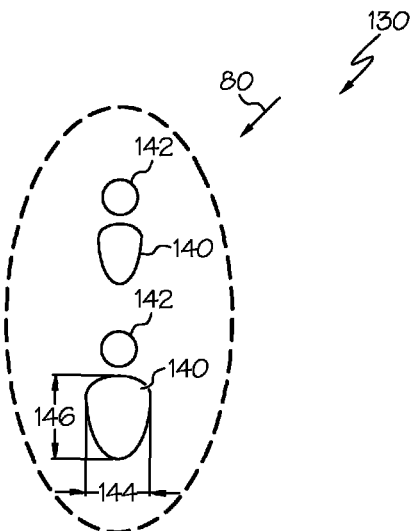
FIG. 8 schematically depicts a detailed top view of the manifold shown at location K of FIG. 7.

Referring to FIGS. 7 and 8, portions of the manifold 130 are depicted in greater detail. In the depicted embodiment, fluid introduced to the distribution side 132 of the manifold 130 flows in a downstream direction 80 from the fluid inlet 122 towards the orifices 142. It should be understood that the fluid flowing from the fluid inlet 122 to the orifices 142 may not follow the shortest path length. Accordingly, as used herein, "downstream" refers to the direction and relative orientation of the flow of the fluid away from the fluid inlet 122. When evaluating two adjacent orifices 142, the orifice 142 positioned further from the fluid inlet 122 is generally located in a downstream direction from the orifice 142 positioned nearer to the fluid inlet 122.

As the fluid approaches the orifices 142, fluid positioned proximate to a particular orifice 142 will flow through the orifice 142, thereby forming a jet that is ejected through the manifold 130 towards the heat distribution member 180. Fluid that remains on the distribution side 132 continues to flow in the downstream direction 80, until the fluid is directed through one of the surrounding orifices 142 and towards the heat distribution member 180.

As some of the fluid passes through orifices 142 away from the distribution side 132 of the manifold 130, the flow rate of the fluid in the downstream direction 80 may decrease. To maintain the flow rate of the fluid, which may help maintain even pressure along the distribution side 132 of the manifold 130, the distribution side 132 of the manifold 130 may include a plurality of flow conditioning members 140 that are positioned in the downstream direction 80 from each of the orifices 142. The flow conditioning members 140 decrease the cross-sectional area of the distribution side 132, such that the cross-sectional area of the distribution side 132 at distal locations from the fluid inlet 122 is smaller than the cross-sectional area of the distribution side 132 at proximal locations to the fluid inlet 122. The decrease in cross-sectional area of the distribution side 132 may accelerate the flow of the remaining fluid along the distribution side 132 of the manifold 130, such that the flow rate and/or the pressure of the fluid is approximately equal across all of the orifices 142. In the embodiment depicted in FIGS. 4-5, the volume of the flow conditioning members 140 (and the corresponding decrease in the cross-sectional area of the distribution side 132) increases with increasing distance from the fluid inlet 122 in the downstream direction 80. The area along the distribution side 132 that fluid flows along correspondingly decreases relative to the volume of the flow conditioning members 140. This decrease in the area along the distribution side 132 may maintain the flow rate of the fluid at orifices 142 positioned distally from the fluid inlet 122. Consistent flow rate of the fluid across all of the orifices 142 in the manifold 130 may contribute to evenness of the impingement jets produced by all of the orifices 142, and may contribute to even cooling of the heat distribution member 180 positioned proximate to the orifices 142.

The flow conditioning members 140 may have an oblong shape in which a chord 146 of the flow conditioning member 140 is greater than the maximum width 144 of the flow conditioning member 140 evaluated normal to the chord 146. In these embodiments, the generally oblong shape of the flow conditioning members 140 may reduce the cross-sectional area of the distribution side 132 of the manifold 130 while reducing the pressure loss imparted to the fluid due to the constriction in the downstream direction 80. In some embodiments, the chords 146 of the flow conditioning members 140 are oriented to be generally parallel to the downstream direction of the fluid flowing from the fluid inlet 122.

In some embodiments, heat from the heat distribution member 180 transfers into the fluid, decreasing the density of the fluid. In some embodiments, heat transferred to the fluid may impart sufficient heat to the fluid to undergo a phase transformation from a liquid to a gas. Such a phase transformation may remove significant heat energy from the heat distribution member 180, which may be beneficial for managing the temperature of the electronics devices 94. In some embodiments, change in phase from a liquid to a gas results in a large volumetric increase in the fluid, as the gas generally occupies a larger volume than the liquid of the same substance at the same pressure. Accordingly, removal of the heated fluid from the jet impingement assembly 100 may be important to provide continuous cooling to the heat distribution member 180.

Figure 9:
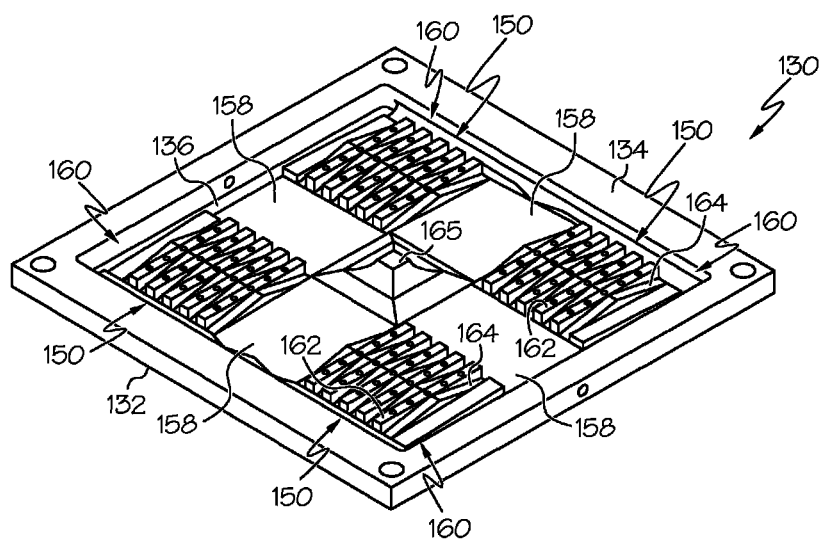
FIG. 9 schematically depicts a side perspective view of a collection side of a manifold of a jet impingement assembly according to one or more embodiments shown or described herein.

Referring now to FIG. 9, the collection side 134 of one embodiment of the manifold 130 is depicted. The collection side includes a plurality of flowpath constriction members 160 positioned proximate to the orifices 142. The flowpath constriction members 160 include injection constriction regions 162 though which the orifices 142 pass. The flowpath constriction members 160 also include extraction constriction regions 164. Within a flowpath constriction member 160, the injection constriction regions 162 and the extraction constriction regions 164 are generally alternated with one another.

The flowpath constriction members 160 are positioned in a plurality of discrete cooling zones 150 that generally correspond to the location of the electronics devices 94 (see FIG. 2). The cooling zones 150 are separated from one another by exhaust channels 158. The cross-sectional flow area within the cooling zones 150 is generally less than the cross sectional area within the exhaust channels 158, such that pressurized fluid will tend to flow out of the cooling zones 150 and towards the exhaust channels 158. In the depicted embodiment, the exhaust channels 158 are positioned to divert flow towards the return channels 136, such that heated fluid is directed away from the cooling zones 150 and towards the fluid outlet 124 after extracting heat from the heat distribution member 180.

The manifold 130 may further include a flow diverter 165 positioned along the collection side 134 of the manifold and positioned proximate to the exhaust channels 158. In the embodiment depicted in FIG. 9, the flow diverter 165 is centrally-located at intersections of the exhaust channels 158. The flow diverter 165 extends away from the exhaust channels 158, thereby introducing a flow constriction between the collection side 134 of the manifold 130 and the heat distribution member 180. The flow diverter 165 creates a flow restriction that directs fluid flow within the exhaust channels 158. In this embodiment, the flow diverter 165 is positioned proximate to the center of the manifold such that fluid that enters the exhaust channels 158 is directed away from the flow diverter 165 and towards the periphery of the manifold 130. As fluid is directed towards the periphery of the manifold 130, the fluid may be exhausted to the return channels 136. The flow diverter 165, therefore, may reduce fluid flow from one exhaust channel 158 into another exhaust channel 158. Maintaining flow of fluid from the cooling zones 150 towards the return channels 136 may assist with consistent delivery of fluid from the manifold 130 to the heat distribution member 180.

Figure 10:
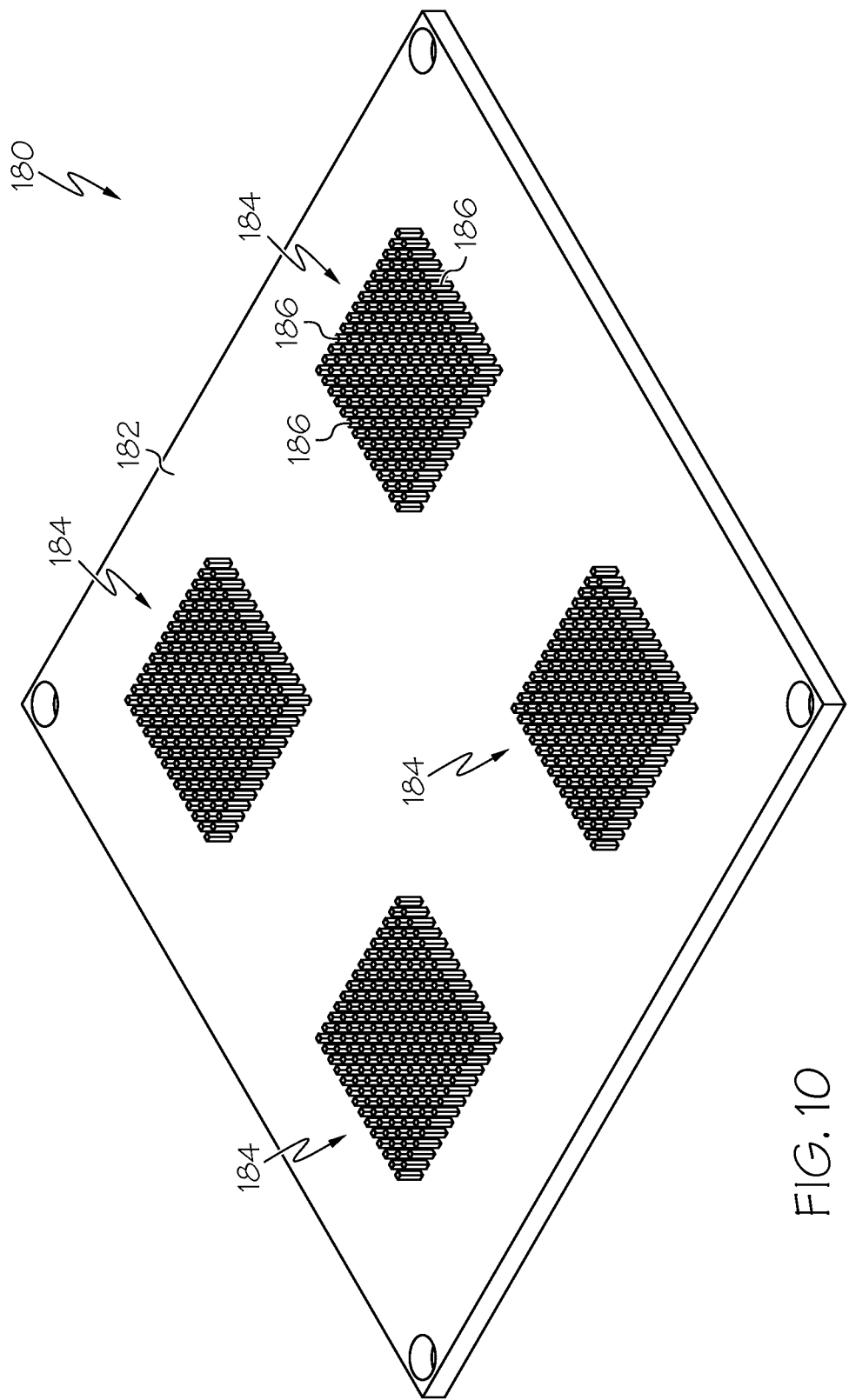
FIG. 10 schematically depicts a side perspective view of a heat distribution member of a jet impingement assembly according to one or more embodiments shown or described herein.

Referring now to FIG. 10, one embodiment of the heat distribution member 180 is depicted. In this embodiment, the heat distribution member 180 includes a conduction plate 182 and a plurality of fins 186 that extend from the conduction plate 182. In the depicted embodiment, the fins 186 are grouped into a plurality of discrete heat transfer zones 184, which correspond to the locations of the electronics devices 94 (see FIG. 2). The fins 186 increase the local surface area of the heat distribution member 180, such that fluid delivered to the heat distribution member 180 may efficiently convect heat away from the heat distribution member 180. By increasing the surface area of the heat distribution member 180, the heat transfer rate from the heat distribution member 180 to the fluid may be enhanced. The fins 186 target the heat transfer rate from the heat distribution member 180 to maximize cooling of the electronics devices 94. In some embodiments, the heat distribution member 180, including the fins 186, may have a variety of configurations including being made from uniform, isotropic materials, non-isotropic materials, composite materials, or the like. In some embodiments, the fins 186 of the heat distribution member 180 may include a coating, for example a porous coating, that increases the surface area of the fins 186, thereby increasing heat transfer away from the heat distribution member 180. In some embodiments, the fins 186 may be constructed from a porous material. Additionally, it should be understood that certain embodiments of the jet impingement assembly 100 may not be provided with fins.

Figure 11:
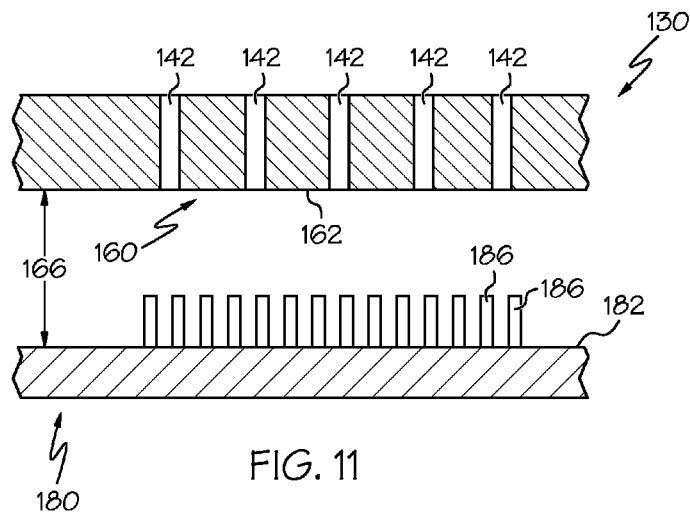
FIG. 11 schematically depicts a side sectional view of a portion of a jet impingement assembly shown along line C-C of FIG. 2.
Figure 12:
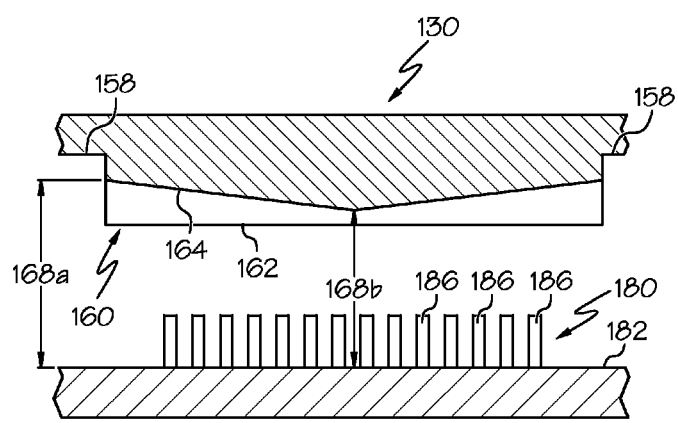
FIG. 12 schematically depicts a side sectional view of a portion of a jet impingement assembly shown along line D-D of FIG. 2.

Referring now to FIGS. 11 and 12, a cross-sectional view of a portion of the jet impingement assembly 100 is depicted. FIG. 11 depicts a portion of the jet impingement assembly 100 at a position that intersects a plurality of orifices 142 and the injection constriction region 162. FIG. 12 depicts a portion of the jet impingement assembly 100 at a position that intersects the extraction constriction region 164. As depicted in FIGS. 11 and 12, the injection distance 166, which corresponds to the distance between the injection constriction region 162 of the manifold 130 and the conduction plate 182 of the heat distribution member 180 is less than the extraction distance 168a, 168b, which corresponds to the distance between the extraction constriction region 164 of the manifold 130 and the conduction plate 182 of the heat distribution member 180. In such embodiments, the extraction constriction regions 164 are sloped away from the heat distribution member 180 towards the exhaust channel 158, such that fluid in the extraction constriction regions 164 is directed towards the exhaust channels 158. In general, fluid that is ejected from the manifold 130 towards the heat distribution member 180 has a tendency to flow from regions of low cross-sectional area towards areas of high cross-sectional area. Because the extraction distance 168a, 168b is greater than the injection distance 166, fluid positioned between the manifold 130 and the heat distribution member 180 will tend to travel towards the extraction constriction region 164 and away from the injection constriction region 162.

Referring collectively to FIGS. 2 and 11-12, it should be understood that the injection distance 166 and the extraction distance 168a, 168b may jointly be modified by incorporating a second gasket 172 having a thickness that is modified from a baseline thickness. By modifying the thickness of the second gasket 172, both the injection distance 166 and the extraction distance 168a, 168b may be changed by a similar amount.

Referring again to FIGS. 11 and 12, in embodiments of the jet impingement assembly 100 in which the fluid undergoes a phase transformation from a liquid to a gas, incorporation of the injection constriction regions 162 and the extraction constriction regions 164 into the manifold 130 may assist with extraction of fluid away from the heat distribution member 180. Thus, incorporation of the injection constriction regions 162 and the extraction constriction regions 164 into the manifold 130 may provide the desired convective heat transfer to draw heat away from the heat distribution member 180 while ensuring that the heated fluid is directed away from the heat distribution member 180 so that heat may be transferred away from the heat distribution member 180 in a steady-state operation.

As further depicted in FIG. 12, the extraction constriction regions 164 may include faceted faces that are biased away from the heat distribution member 180 at positions proximate to the exhaust channels 158 of the manifold 130, such that the extraction constriction regions 164 include faces that are sloped towards the exhaust channels 158. In these embodiments, the extraction distance 168a evaluated at positions proximate to the exhaust channels 158 may be greater than the extraction distance 168b evaluated at positions that are distally spaced from the exhaust channels 158 (i.e., at positions proximate to the center of the flowpath constriction members 160). Incorporating extraction constriction regions 164 into the manifold 130 having faceted faces that are biased away from the heat distribution member 180 may further direct heated fluid away from the heat distribution member 180 and towards the exhaust channels 158 of the manifold 130, thereby maintaining fluid circulation away from the heat distribution member 180.

The faceted faces of the extraction constriction regions 164 may also prevent vapor stagnation along the manifold 130 such that gaseous fluid that vaporizes due to transfer of heat from the heat distribution member 180 do not become impeded from flowing towards the exhaust channels 158 and/or the return channel 136 of the manifold 130. Reducing the likelihood of vapor stagnation along the collection side 134 of the manifold may improve fluid flow through the jet impingement assembly 100 and may maintain even heat transfer from the heat distribution member 180 to the fluid.

It should now be understood that jet impingement assemblies and power electronics modules incorporating jet impingement assemblies allow for efficient transfer of heat away from electronics devices, which may increase the life of the electronics device. The jet impingement assemblies include a manifold having a plurality of orifices that direct jets of fluid towards a heat distribution member. The manifold may include a plurality of flow conditioning members along the distribution side of the manifold that direct the flow of fluid towards the orifices to provide even distribution of impingement jets across the manifold. The manifold may also include a plurality of flowpath constriction members that direct the flow of heated fluid away from the heat distribution member, which may ensure continuous heat transfer away from the heat distribution member. The flowpath constriction members may prevent stagnation of heated fluid along the surfaces, which would be detrimental to performance of jet impingement assemblies in which the fluid changes from a liquid state to a gaseous state.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A jet impingement assembly comprising:
a fluid inlet;
a fluid outlet;
a manifold comprising a distribution side in fluid communication with the fluid inlet, a collection side in fluid communication with the fluid outlet, a plurality of orifices extending from the distribution side to the collection side, a return channel extending from the collection side to the distribution side, and a plurality of flowpath constriction members positioned on the collection side; and
a heat distribution member positioned proximate to the collection side of the manifold, the heat distribution member comprising a plurality of fins that extend towards the collection side of the manifold:,
wherein the plurality of flowpath constriction members include injection constriction regions that extend outward from a surface of the collection side such that the injection constriction regions are spaced an injection distance from the heat distribution member, and extraction constriction regions that extend outward from the surface of the collection side such that the extraction constriction regions are spaced an extraction distance from the heat distribution member, the extraction distance being greater than the injection distance.

2. The jet impingement assembly of claim 1, wherein the flowpath constriction members are positioned in a plurality of discrete cooling zones, the cooling zones separated from one another by exhaust channels.

3. The jet impingement assembly of claim 2, wherein the extraction constriction regions are biased relative to the injection constriction regions, such that the extraction distance evaluated proximate to the exhaust channels is greater than the extraction distance evaluated distally from the exhaust channels.

4. The jet impingement assembly of claim 1, wherein the manifold further comprises a plurality of flow conditioning members positioned along the distribution side.

5. The jet impingement assembly of claim 4, wherein each of the plurality of flow conditioning members is positioned in a downstream direction from one of the plurality of orifices.

6. The jet impingement assembly of claim 4, wherein a volume of the flow conditioning members increases with increasing distance from the fluid inlet.

7. The jet impingement assembly of claim 4, wherein at least one of the flow conditioning members has an oblong shape in which a chord of the flow conditioning member is greater than the maximum width evaluated normal to the chord.

8. A jet impingement assembly comprising:
a fluid inlet;
a fluid outlet;
a manifold comprising a distribution side in fluid communication with the fluid inlet, a collection side in fluid communication with the fluid outlet, a plurality of orifices extending from the distribution side to the collection side, a return channel extending from the collection side to the distribution side, and a plurality of flow conditioning members positioned along the distribution side, wherein a volume of a first flow conditioning member is less than a volume of a second flow conditioning member, wherein the first flow conditioning member is positioned closer to the fluid inlet than the second flow conditioning member; and a heat distribution member positioned proximate to the collection side of the manifold.

9. The jet impingement assembly of claim 8, wherein each of the plurality of flow conditioning members is positioned in a downstream direction from one of the plurality of orifices.

10. The jet impingement assembly of claim 8, wherein at least one of the flow conditioning members has an oblong shape in which a chord of the flow conditioning member is greater than the maximum width evaluated normal to the chord.

11. The jet impingement assembly of claim 8, wherein the heat distribution member further comprises a plurality of fins that extend towards the collection side of the manifold.

12. The jet impingement assembly of claim 11, wherein the manifold further comprises a plurality of flowpath constriction members positioned on the collection side of the manifold that are positioned proximate to the plurality of fins of the heat distribution member.

13. The jet impingement assembly of claim 12, wherein the flowpath constriction members include injection constriction regions that are spaced an injection distance from the heat distribution member and extraction constriction regions that are spaced an extraction distance from the heat distribution member, the extraction distance being greater than the injection distance.

14. The jet impingement assembly of claim 13, wherein the flowpath constriction members are positioned in a plurality of discrete cooling zones, the cooling zones separated from one another by exhaust channels.

15. The jet impingement assembly of claim 14, wherein the extraction constriction regions are biased relative to the injection constriction regions, such that the extraction distance evaluated proximate to the exhaust channels is greater than the extraction distance evaluated distally from the exhaust channels.

16. A power electronics module comprising:
a jet impingement assembly comprising:
 a fluid inlet;
 a fluid outlet;
 a manifold comprising a distribution side in fluid communication with the fluid inlet, a collection side in fluid communication with the fluid outlet, a plurality of orifices extending from the distribution side to the collection side, a return channel extending from the collection side to the distribution side, and a plurality of flowpath constriction members positioned on the collection side of the manifold; and
 a heat distribution member positioned proximate to the collection side of the manifold, the heat distribution member comprising a plurality of fins that extend towards the collection side of the manifold;
 wherein the plurality of flowpath constriction members include injection constriction regions that extend outward from a surface of the collection side such that the injection constriction regions are spaced an injection distance from the heat distribution member, and extraction constriction regions that extend outward from the surface of the collection side such that the extraction constriction regions are spaced an extraction distance from the heat distribution member, the extraction distance being greater than the injection distance; and
an electronics device positioned to contact the heat distribution member opposite the plurality of fins.

17. The power electronics module of claim 16, wherein the plurality of flowpath constriction members are positioned proximate to the fins of the heat distribution member.

18. The power electronics module of claim 16, wherein the manifold further comprises a plurality of flow conditioning members positioned along the distribution side.

* * * * *